(12) United States Patent
Kasahara

(10) Patent No.: US 10,469,040 B2
(45) Date of Patent: Nov. 5, 2019

(54) CONTROL DEVICE USING GAN SEMICONDUCTOR

(71) Applicant: ADVANTEST Corporation, Tokyo (JP)

(72) Inventor: Kiyotaka Kasahara, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 15/796,315

(22) Filed: Oct. 27, 2017

(65) Prior Publication Data

US 2018/0183393 A1 Jun. 28, 2018

(30) Foreign Application Priority Data

Dec. 28, 2016 (JP) ................. 2016-256523

(51) Int. Cl.
| | | |
|---|---|---|
| *H03F 3/45* | (2006.01) | |
| *H03F 3/21* | (2006.01) | |
| *H03G 3/30* | (2006.01) | |
| *H02M 1/08* | (2006.01) | |
| *H03F 3/217* | (2006.01) | |

(52) U.S. Cl.
CPC ............. *H03F 3/21* (2013.01); *H02M 1/08* (2013.01); *H03F 3/2171* (2013.01); *H03F 3/45071* (2013.01); *H03F 3/45183* (2013.01); *H03G 3/3042* (2013.01); *H03G 3/3078* (2013.01); *H03F 2200/66* (2013.01)

(58) Field of Classification Search
CPC ...... H03F 3/21; H03F 3/45071; H03F 3/2171; H03F 3/45183; H03F 2200/66; H03G 3/3042; H03G 3/3078; H02M 1/08

USPC ................................ 330/9, 69, 252, 253
See application file for complete search history.

(56) References Cited

U.S. PATENT DOCUMENTS

| | | | | |
|---|---|---|---|---|
| 5,907,261 | A * | 5/1999 | Jones .................. | H03G 3/30 330/254 |
| 6,072,366 | A * | 6/2000 | Maeda ................ | H04B 10/6931 250/214 A |
| 6,087,899 | A * | 7/2000 | Kubota ................ | H03F 1/48 330/253 |
| 6,778,010 | B1 * | 8/2004 | Michalski ............ | H03F 3/005 330/253 |
| 8,125,273 | B2 * | 2/2012 | Muentefering ..... | H01S 5/06213 330/253 |
| 2005/0134381 | A1 * | 6/2005 | Dyer ................... | H03F 3/005 330/258 |
| 2006/0038616 | A1 * | 2/2006 | Morgan ............... | H03F 1/301 330/261 |

(Continued)

FOREIGN PATENT DOCUMENTS

| | | |
|---|---|---|
| JP | 2009-124667 A | 6/2009 |
| JP | 2012-007992 A | 1/2012 |

(Continued)

*Primary Examiner* — Khanh V Nguyen
(74) *Attorney, Agent, or Firm* — Osha Liang LLP

(57) ABSTRACT

A control device includes: a differential amplification circuit that amplifies a difference with respect to an input signal; and a clipping circuit that is connected to an output side of the differential amplification circuit and clips an input voltage. The differential amplification circuit includes a plurality of switching elements formed of a GaN semiconductor, and the clipping circuit includes a switching element formed of the GaN semiconductor.

9 Claims, 10 Drawing Sheets

(56) References Cited

U.S. PATENT DOCUMENTS

| | | | |
|---|---|---|---|
| 2007/0236288 A1* | 10/2007 | Lin | H03F 3/45183 |
| | | | 330/253 |
| 2008/0211567 A1 | 9/2008 | Morita et al. | |
| 2009/0128232 A1* | 5/2009 | Deng | H03F 3/005 |
| | | | 330/9 |
| 2011/0316554 A1 | 12/2011 | Hata et al. | |
| 2013/0002358 A1* | 1/2013 | Mitchell | G01D 3/036 |
| | | | 330/289 |
| 2014/0002105 A1 | 1/2014 | Hata et al. | |

FOREIGN PATENT DOCUMENTS

| | | |
|---|---|---|
| JP | 2012-129936 A | 7/2012 |
| JP | 2014-011520 A | 1/2014 |
| WO | 2012/126403 A2 | 9/2012 |
| WO | 2012/126403 A3 | 9/2012 |

* cited by examiner

CONTROL DEVICE USING GAN SEMICONDUCTOR

TECHNICAL FIELD

The present invention relates to a control device using a GaN semiconductor.

BACKGROUND ART

Switch devices using a GaN semiconductor for a main switch are known (for example, Patent Document 1).

CITATION LIST

Patent Document

Patent Document 1: JP 2014-011520 A

SUMMARY

In a case where a control device controls a control target based on an input signal and the GaN semiconductor is used for the switching element includes in the control device, stability (robustness) of the control device is lowered due to the variation in the threshold voltage of the switching element.

One or more embodiments of the invention provide a control device capable of improving stability by using a GaN semiconductor for a switching element.

[1] A control device according to one or more embodiments of the invention includes: a differential amplification circuit which amplifies a difference with respect to an input signal; and a clipping circuit which is connected to an output side of the differential amplification circuit and clips an input voltage, wherein the differential amplification circuit includes a plurality of switching elements formed of a GaN semiconductor, and the clipping circuit includes a switching element formed of the GaN semiconductor.

[2] In one or more embodiments, the control device may further include an amplification circuit which is connected to the output side of the differential amplification circuit and amplifies a voltage difference of voltages output from the differential amplification circuit, wherein the amplification circuit includes a switching element formed of the GaN semiconductor.

[3] In one or more embodiments, the control device may further include a level shift circuit which is connected to the output side of the differential amplification circuit and shifts a level of a voltage output from the differential amplification circuit, wherein the level shift circuit may include a switching element formed of the GaN semiconductor.

[4] In one or more embodiments, the control device may include a voltage variable circuit which is capable of changing a control voltage of the switching element included in the differential amplification circuit, and the differential amplification circuit may amplify the difference between a voltage of the input signal and the control voltage.

[5] In one or more embodiments, the control device may further include a current source which is connected to the differential amplification circuit, wherein the current source includes a switching element formed of the GaN semiconductor.

[6] In one or more embodiments, the control device may include a current source which is commonly connected to each terminal of the plurality of switching elements included in the differential amplification circuit.

[7] In one or more embodiments, in the control device, the plurality of switching elements included in the differential amplification circuit may be symmetrically connected, the input signal may be input to a control terminal of one switching element among the plurality of switching elements, a reference voltage may be input to a control terminal of the other switching element among the plurality of switching elements, the input signal may indicate any one of a high level voltage value and a low level voltage value, and the voltage value of the reference voltage may be set between the high level voltage value and the low level voltage value.

One or more embodiments of the invention comprise a differential amplification circuit which amplifies a difference with respect to an input signal, and a clipping circuit which is connected to the output side of the differential amplification circuit and clips an input voltage. A plurality of switching elements included in the differential amplification circuit and switching elements included in the clipping circuit are formed of GaN semiconductor. Therefore, it is possible to improve stability of the control device.

DETAILED DESCRIPTION OF EMBODIMENTS

Hereinafter, embodiments of the invention will be described with reference to the drawings.

Figure 1:
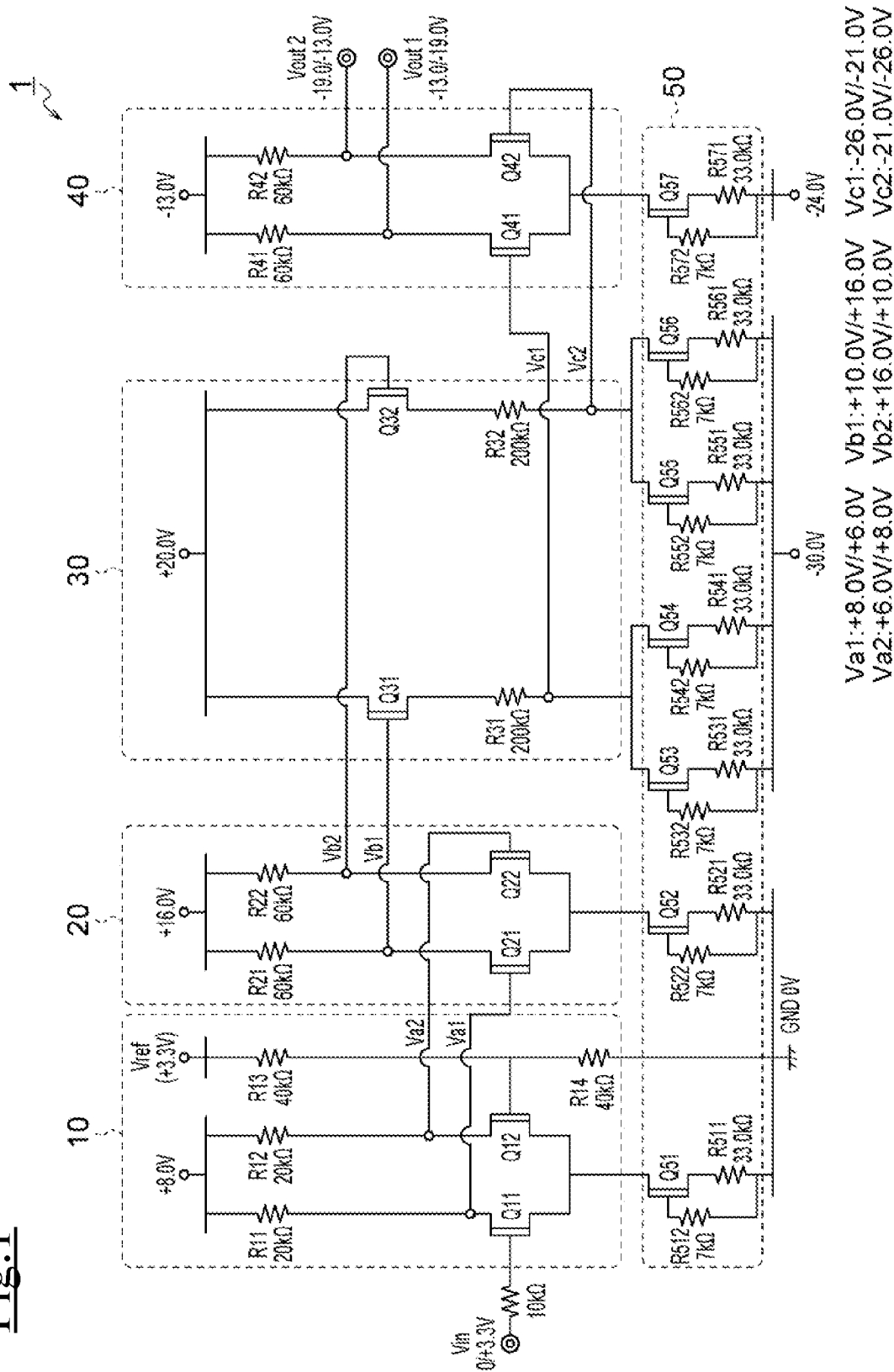
FIG. 1 is a circuit diagram of a control device according to one or more embodiments of the invention.

A control device 1 according to one or more embodiments will be described with reference to FIG. 1. FIG. 1 is a circuit diagram of the control device 1 according to one or more embodiments.

The control device 1 is a control circuit for switching ON and OFF of a main switch on the basis of an input signal. The input signal is a switching signal input externally, and a waveform of the input signal is an ON/OFF waveform of high level (ON voltage) and low level (OFF voltage). The control device 1 amplifies the voltage of the input signal and shifts the voltage level (converts the voltage level) in order to switch ON and OFF of the main switch according to a voltage difference of the input signal. The voltage difference of the input signal corresponds to a difference between the high level voltage indicating the ON state and the low level voltage indicating the OFF state.

The control device 1 includes differential amplification circuits 10 and 20, a level shift circuit 30, a differential amplification circuit 40, and a current source 50. The control device 1 includes a plurality of switching elements, and each switching element is formed of a GaN semiconductor.

Herein, element characteristics of GaN (gallium nitride) based elements will be described in comparison with the element characteristics of silicon (Si) based elements. In comparison with the Si-based element, the GaN-based element has superior characteristics such as dielectric breakdown strength, thermal conductivity, operability in a high temperature state and is superior in physical properties as a material. On the other hand, since the processes (manufacturing process, versatility to the market) for the GaN-based elements have not been matured in comparison with the Si-based elements, the variation in GaN semiconductor element is large.

In a case where a switch device having a main switch and a control circuit is exemplified, the following switch device is conceivable as a configuration for avoiding the variation in GaN-based element. The main switch is formed of a GaN semiconductor, and the control circuit for controlling the main switch is configured with a Si-based switch. Then, the main switch and the control circuit are formed in a multi-chip module. Currently, many switch devices employ such a configuration.

In the above-described switch device, since the control circuit is configured with Si-based elements, it is difficult to realize high density or high heat resistance of resources. Namely, in order to realize high density of resources or improvement of heat resistance, the switch device may be configured monolithically with a GaN semiconductor by using the GaN semiconductor for the switching element of a control system in addition to the main switch. In other words, not only the main switch but also all the switching elements included in the switch device may be formed of a GaN semiconductor.

However, in a case where the control circuit is monolithically configured with a GaN semiconductor, variation in the GaN semiconductor element may occur. In the GaN-based switches, some cases, variation may occur in the threshold voltage for switching ON and OFF due to element variation such as epitaxial resistance. Then, in a case where the variation in the GaN switch is large, the robustness (control stability) of the control circuit is lowered. The control device 1 according to one or more embodiments is a control circuit (IC circuit) monolithically configured with a GaN semiconductor. It is possible to realize robustness while using a GaN switch having large variation by employing the circuit configuration as illustrated in FIG. 1. In addition, the circuit configuration illustrated in FIG. 1 is merely an example. The power supply voltage, the resistor element, or the connection form of the circuit elements may be changed according to the voltage range of the input signal or the operating voltage range of the main switch.

As illustrated in FIG. 1, the differential amplification circuit 10 is provided on the input side of the control device 1. The differential amplification circuit 10 is a unilateral input differential circuit and amplifies a difference with respect to the input signal. The differential amplification circuit 10 includes a plurality of switching elements Q11 and Q12 and resistors R11 to R14, which are connected symmetrically. The resistance values of the resistor R11 and the resistor R12 are 20 kΩ. The resistance values of the resistors R13 and R14 are 40 kΩ. The switching element Q11 and the switching element Q12 are formed of a GaN semiconductor. The characteristics of switching element Q11 and switching element Q12 are the same. An input signal is input to the gate terminal (control terminal) of the switching element Q11, and a reference voltage is input to the gate terminal of the switching element Q12. The input signal ($V_{in}$) is a switching signal with 0 V as the low level and +3.3 V as the high level. $V_{in}$ is a voltage (input voltage) of the input signal. A gate resistor (R15) is connected to the gate terminal of the switching element Q11. The drain terminal of the switching element Q11 is connected to a reference power supply through the resistor R11, and the drain terminal of the switching element Q12 is connected to a power supply through the resistor R12. The power supply voltage is set to +8.0 V. The source terminal of the switching element Q11 and the source terminal of the switching element Q12 are commonly connected to one current source.

The resistors 13 and 14 are resistors for dividing the reference voltage ($V_{ref}$) and are connected in series between a power supply for the reference voltage and a ground point (GND). The connection point between the resistor 13 and the resistor 14 is connected to the drain terminal of the switching element Q12. Therefore, the divided reference voltage ($V_{ref}$) is applied to the drain terminal of the switching element Q12. The reference voltage input to the drain terminal of the switching element Q12 is set to a midpoint voltage of the input signal input to the gate terminal of the switching element Q11. The midpoint voltage is a voltage between the high level and the low level of the input signal.

A pair of output wirings is connected to the drain terminal of the switching element Q11 and the drain terminal of the switching element Q12, respectively.

A differential amplification circuit 20 is connected to the output side of the differential amplification circuit 10 and amplifies a difference between the output voltages output from the differential amplification circuit 10. The differential amplification circuit 20 includes switching elements Q21 and Q22 and resistors R21 and R22. The resistance values of the resistors R21 and R22 are 60 kΩ. The switching elements Q21 and Q22 are formed of a GaN semiconductor. The characteristics of the switching element Q21 and the switching element Q22 are the same. The switching elements Q21 and Q22 are symmetrically connected, and output lines of the differential amplification circuit 10 are connected to each of the gate terminals thereof. The drain terminal of the switching element Q21 is connected to the power supply through the resistor R21, and the drain terminal of the switching element Q22 is connected to the power supply through the resistor R22. The power supply voltage is set to +16.0 V. The source terminals of the switching elements Q21 and Q22 are commonly connected to one current source. A pair of output wirings is connected to the drain terminal of the switching element Q21 and the drain terminal of the switching element Q22, respectively.

The level shift circuit 30 is a circuit that shifts the level of the voltage output from the differential amplification circuit 20. The level shift circuit 30 converts the output of the differential amplification circuit 20 to an output voltage with reference to a minus potential. The level shift circuit 30 is connected to the output side of the differential amplification circuits 10, 20. The level shift circuit 30 includes switching elements Q31 and Q32 and resistors R31 and R32. The resistance values of the resistors R31 and R32 are 200 kΩ. The switching elements Q31 and Q32 are formed of a GaN semiconductor. The characteristics of the switching element Q31 and the switching element Q32 are the same. The switching elements Q31 and Q32 are symmetrically connected, and the output line of the differential amplification circuit 20 is connected to each of the gate terminals thereof. The drain terminal of the switching element Q31 and the drain terminal of the switching element Q32 are connected to the power supply. The power supply voltage is +20.0 V. The resistor R31 is connected to the source terminal of the switching element Q31, and the resistor R32 is connected to the source terminal of the switching element Q32. The source terminal of the switching element Q31 and the source terminal of the switching element Q32 are respectively connected to independent current sources through the resistors R31 and R32. An output wiring is connected to a terminal (terminal on the side opposite to the source terminal of the switching element Q31) on the low potential side of the resistor R31. An output wiring is connected to a terminal (terminal on the side opposite to the source terminal of the switching element Q32) on the low potential side of the resistor R32.

The differential amplification circuit 40 is a circuit that clips the voltage output from the level shift circuit 30. In addition, the differential amplification circuit 40 performs shaping the output voltage waveform by reducing the voltage range (range of from −24 V to −13 V) applied to the differential amplification circuit 40 with respect to the voltage range (range of from −30 V to +20 V) applied to the level shift circuit 30. The voltage on the high level side among the output voltages of the differential amplification circuit 40 is limited to a limit voltage which is lower than an upper limit voltage output from the level shift circuit 30. The voltage on the low level side among the output voltages of the differential amplification circuit 40 is limited to a limit voltage which is higher than a lower limit voltage output from the level shift circuit 30.

The differential amplification circuit 40 is connected to the output side of the differential amplification circuits 10 and 20. The differential amplification circuit 40 includes switching elements Q41 and Q42 and resistors R42 and R43. The resistance values of the resistors R43 and R44 are 200 kΩ. The switching elements Q41 and Q42 are formed of a GaN semiconductor. The characteristics of the switching element Q41 and the switching element Q42 are the same. The switching elements Q41 and Q42 are symmetrically connected, and the output line of the level shift circuit 30 is connected to each of the gate terminals thereof. The drain terminal of the switching element Q41 is connected to the power supply through the resistor R41, and the drain terminal of the switching element Q42 is connected to the power supply through the resistor R42. The power supply voltage is set to −13.0 V. The source terminals of the switching elements Q41 and Q42 are commonly connected to one current source. A pair of output wirings is connected to the drain terminal of the switching element Q41 and the drain terminal of the switching element Q42, respectively.

The current source 50 includes a plurality of constant current circuits. The plurality of constant current circuits are connected to the low current sides of the differential amplification circuits 10 and 20, the level shift circuit 30, and the clipping circuit, respectively. The plurality of constant current circuits serves as current sources for supplying a constant current to the respective circuits. Each of the constant current circuit includes switching elements Q51 to Q57 and resistors R511, R512, R521, R522, R531, R532, R541, R542, R551, R552, R561, R562, R571, and R572. The switching elements Q51 to Q57 are formed of a GaN semiconductor. The resistance values of resistors R511, R521, R531, R541, R551, R561 and R571 are set to 33 kΩ. The resistance values of the resistors R512, R522, R532, R542, R552, R562, and R572 are set to 7 kΩ.

The constant current circuit connected to the differential amplification circuit 10 includes the switching element Q1 and the resistors R511 and R512. The constant current circuit functions as a common current source of the differential amplification circuit 10. The resistor R512 is connected between the gate and the source of the switching element Q1. The resistor R511 is connected in parallel with the resistor R512 and is connected to the source terminal of the switching element Q51.

One constant current circuit is connected to each of the low potential sides of the differential amplification circuit 20 and the differential amplification circuit 40. A constant current circuit is connected to each of the left arm circuit and the right arm circuit included in the level shift circuit 30. The arm circuit corresponds to a circuit in which the switching elements Q31 and Q32 and the resistors R31 and R32 are directly connected. The circuit configuration of each constant current circuit is the same as that of the constant current circuit connected to the differential amplification circuit 10.

The constant current circuits connected to the differential amplification circuits 10 and 20 are connected to the ground point. The plurality of constant current circuits connected to the level shift circuit 30 are connected to a connection point at which a reference voltage (−30.0 V) is set. The constant current circuits connected to the differential amplification circuit 40 are connected to a connection point at which a reference voltage (−24.0 V) is set.

Figure 2:
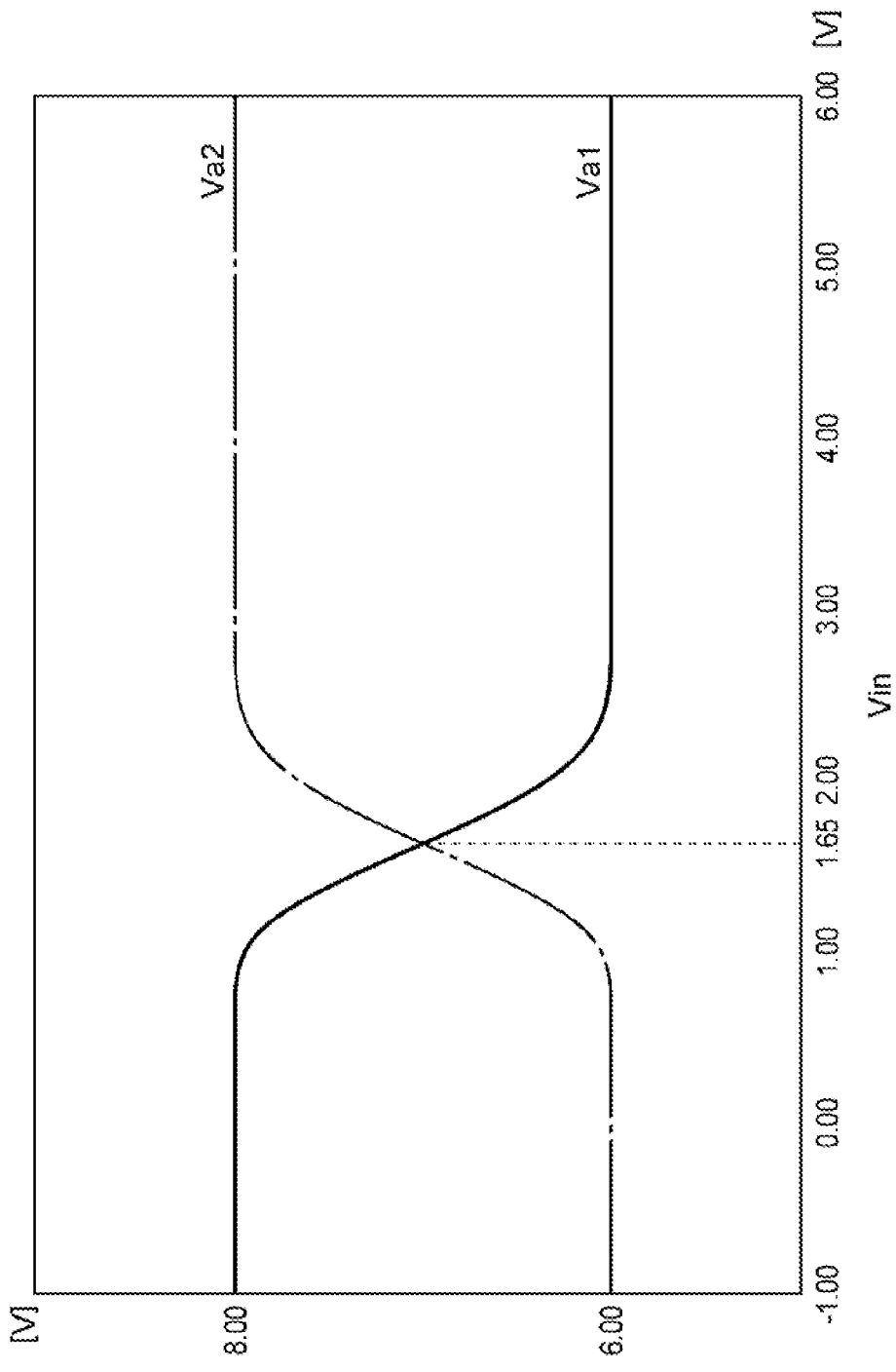
FIG. 2 is a graph illustrating characteristics of output voltages ($V_{a1}$ and $V_{a2}$) with respect to an input voltage ($V_{in}$) in the control device illustrated in FIG. 1.
Figure 3:
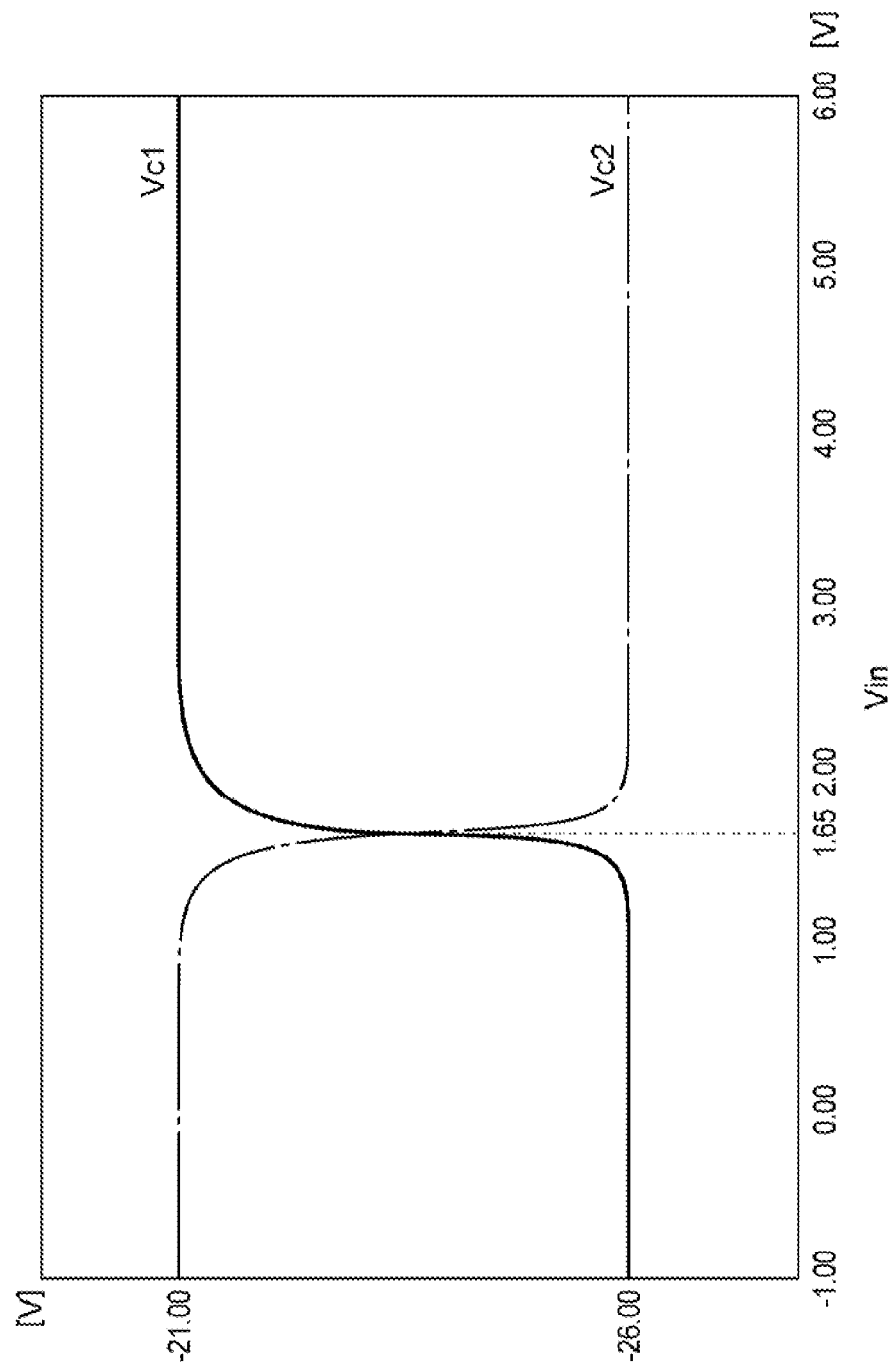
FIG. 3 is a graph illustrating characteristics of output voltages ($V_{c1}$ and $V_{c2}$) with respect to an input voltage ($V_{in}$) in the control device illustrated in FIG. 1.
Figure 4:
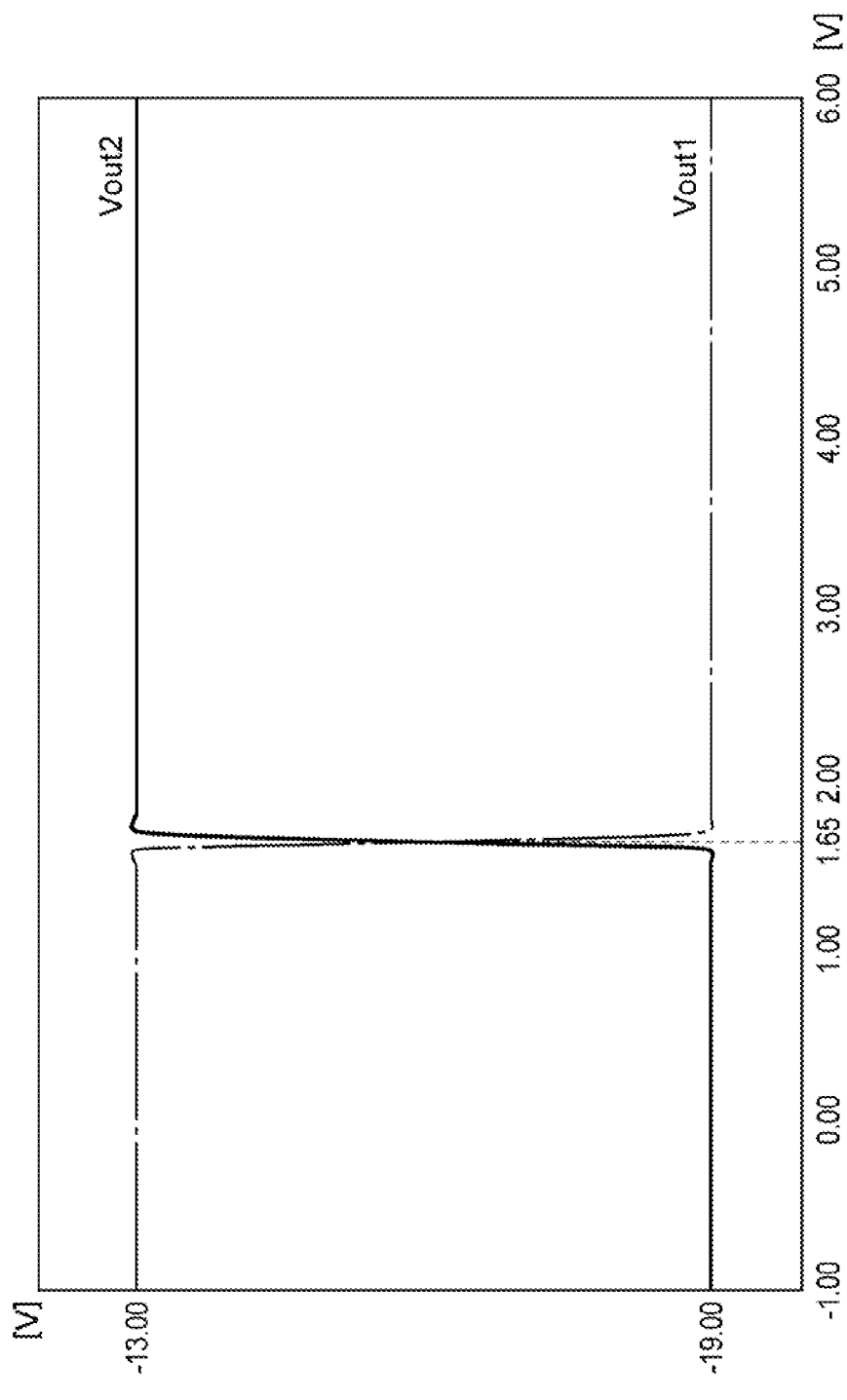
FIG. 4 is a graph illustrating characteristics of output voltages ($V_{OUT1}$) and $V_{OUT2}$) with respect to an input voltage ($V_{in}$) in the control device illustrated in FIG. 1.

Next, the characteristics of the output voltages ($V_{a1}$, $V_{a2}$, $V_{b1}$, $V_{b2}$, $V_{c1}$, and $V_{c2}$) of the circuits with respect to the input voltage ($V_{in}$) of the input signal will be described. $V_{a1}$ and $V_{a2}$ indicate the output voltages of the differential amplification circuit 10. $V_{b1}$ and $V_{b2}$ indicate the output voltages of the level shift circuit 30. $V_{c1}$ and $V_{c2}$ indicate the output voltages of the differential amplification circuit 40. FIG. 2 is a graph illustrating characteristics of the output voltages ($V_{a1}$ and $V_{a2}$) with respect to the input voltage ($V_{in}$). FIG. 3 is a graph illustrating characteristics of the output voltages ($V_{c1}$ and $V_{c2}$) with respect to the input voltage ($V_{in}$). FIG. 4 is a graph illustrating characteristics of the output voltages ($V_{OUT1}$ and $V_{OUT2}$) with respect to the input voltage ($V_{in}$).

The output voltages ($V_{a1}$, $V_{a2}$, $V_{b1}$, $V_{b2}$, $V_{c1}$, and $V_{c2}$) indicate the characteristics when the input voltage ($V_{in}$) is changed in a range of from 0 V to 3.3 V.

In a case where the input signal indicates the OFF state, the input voltage ($V_{in}$) becomes 0 V. At this time, the output voltage ($V_{a1}$) of the differential amplification circuit 10 is 8 V, which is the drain voltage of the switching element Q1. The output voltage ($V_{a2}$) of the differential amplification circuit 10 is 6.0 V, which is the drain voltage of the switching element Q2. In a case where the input signal indicates the ON state, the input voltage ($V_{in}$) becomes 3.3 V. At this time, the output voltage ($V_{a1}$) of the differential amplification circuit 10 becomes 6.0 V. The output voltage ($V_{a2}$) of the differential amplification circuit 10 becomes 8 V. The characteristics of the output voltage ($V_{a1}$) and the characteristics of the output voltage ($V_{a2}$) are ON/OFF waveforms inverted with the input voltage ($V_{in}$) of 1.65 V as the boundary. Namely, by setting the gate voltage of the switching element Q2 to the midpoint voltage between the ON voltage and the OFF voltage of the input signal, the output voltages ($V_{a1}$ and $V_{a2}$) have such characteristics such the output voltage corresponding to the midpoint voltage is a cross point for switching the ON voltage and the OFF voltage.

Although elements with the same characteristics are used for the switching elements Q11 and Q12, the operating characteristics of the switching elements Q11 and Q12 may differ depending on the element variation in practice. The control device 1 according to one or more embodiments utilizes the differential amplification circuit 10 on the input side. For this reason, the element variation is eliminated between the switching elements Q11 and Q12 symmetrically connected. Therefore, it is possible to suppress deterioration in robustness due to the element variation of the switching elements Q11 and Q12.

The output voltage ($V_{b1}$) of the differential amplification circuit 20 becomes a voltage obtained by inverting the output voltage ($V_{a1}$) of the differential amplification circuit 10. The output voltage ($V_{b2}$) of the differential amplification circuit 20 becomes a voltage obtained by inverting the output voltage ($V_{a2}$) of the differential amplification circuit 10. In addition, the input voltage of the differential amplification circuit 20 is amplified by the gain of the differential amplification circuit 20. Therefore, the voltage difference (6 V) between the output voltages ($V_{b1}$ and $V_{b2}$) is larger than the voltage difference (2 V) between the output voltages ($V_{a1}$ and $V_{a2}$).

The output voltage ($V_{c1}$) of the level shift circuit 30 becomes a voltage obtained by shifting the output voltage ($V_{b1}$) of the differential amplification circuit 20 to the minus side. The output voltage ($V_{c2}$) of the level shift circuit 30 becomes a voltage obtained by shifting the output voltage ($V_{b2}$) of the differential amplification circuit 20 to the minus side. As illustrated in FIG. 3, in a case where the input signal indicates the OFF state (input voltage is $V_{in}$=0 V), the output voltage ($V_{c1}$) becomes −26.0 V, and the output voltage ($V_{c2}$) becomes −21.0 V ($V_{c1}$). In a case where the input signal indicates the ON state (input voltage is $V_{in}$=3.3 V), the output voltage ($V_{c1}$) becomes −21.0 V, and the output voltage ($V_{c2}$) becomes −26.0 V. In addition, the output voltages ($V_{c1}$ and $V_{c2}$) have such characteristics of switching the ON voltage and the OFF voltage with the output voltage corresponding to the midpoint voltage as a cross point.

The output voltage ($V_{OUT1}$) of the differential amplification circuit 40 becomes a voltage obtained by inverting the output voltage ($V_{c1}$) of the level shift circuit 30. The output voltage ($V_{OUT2}$) of the differential amplification circuit 40 becomes a voltage obtained by inverting the output voltage ($V_{c2}$) of the level shift circuit 30.

As illustrated in FIG. 4, in the characteristics of the output voltages ($V_{OUT1}$ and $V_{OUT2}$) of the differential amplification circuit 40, since the differential amplification circuit 40 functions as a clipping circuit, the characteristics exhibit a steep transient state (input voltage is within a range of from about 1.1 V to about 2.2 V) between the ON voltage and the OFF voltage. Namely, in comparison with the characteristics (refer to FIG. 2) of the output voltages ($V_{d1}$ and $V_{d2}$) of the differential amplification circuit 10 and the characteristics (refer to FIG. 3) of the output voltages ($V_{c1}$ and $V_{c2}$) of the level shift circuit 30, the characteristics of the output voltages ($V_{OUT1}$ and $V_{OUT2}$) of the differential amplification circuit 40 exhibit a steep transient state between the OFF voltage and the ON voltage.

Figure 5:
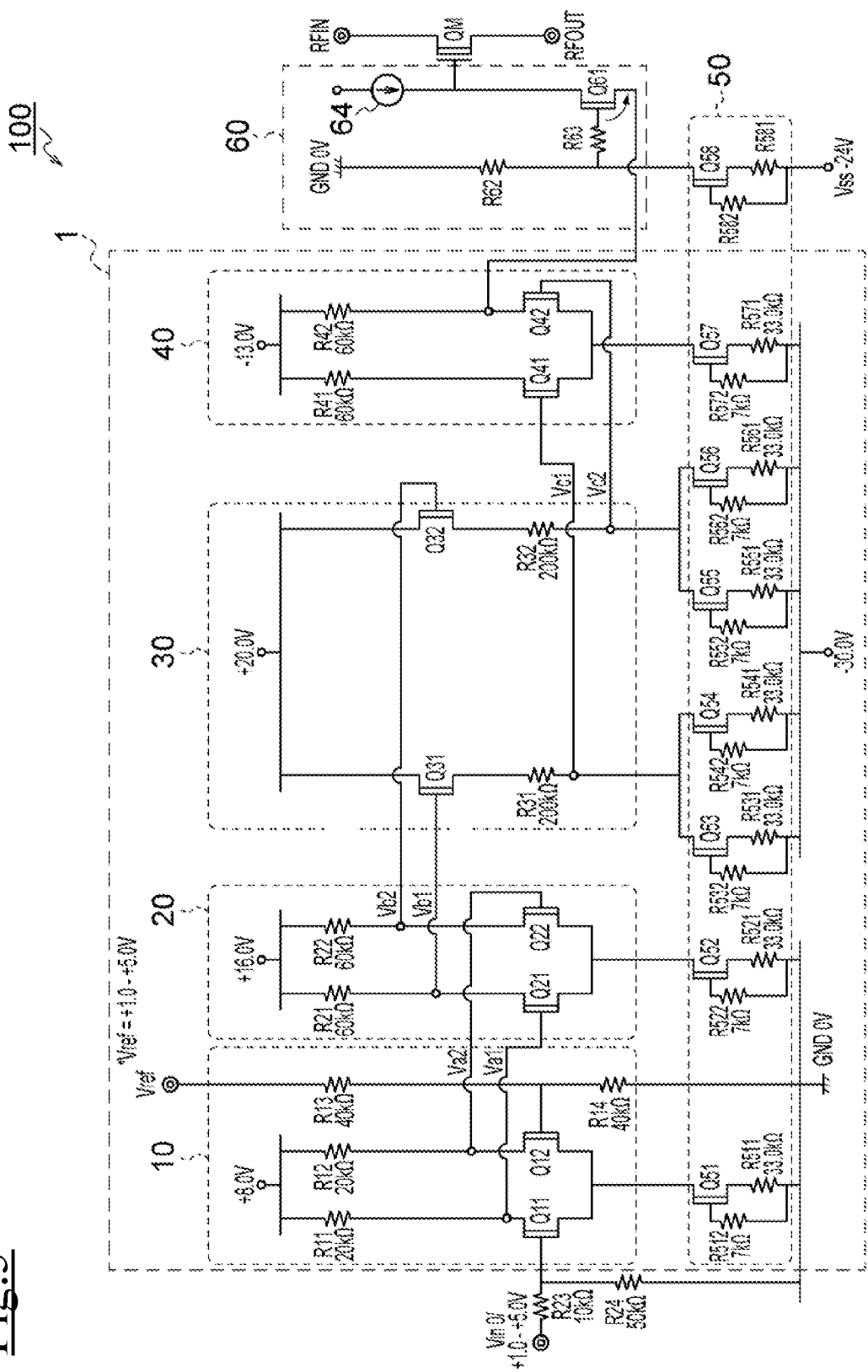
FIG. 5 is a circuit diagram of a switch device according to one or more embodiments of the invention.

Next, a switch device 100 including the control device 1 will be described with reference to FIG. 5. FIG. 5 is a circuit diagram of the switch device 100.

In the switch device 100 illustrated in FIG. 5, the control circuit is basically the same as the control device illustrated in FIG. 1, but differs in the following points. The differential amplification circuit 10 is configured so that the control voltage (gate voltage) of the switching element Q12 is changeable. Specifically, the reference voltage ($V_{ref}$) is configured to changeable within a voltage range of from +1.0 V to +5.0 V. The range in which the reference voltage ($V_{ref}$) is changeable is set according to the voltage range input as the input signal. For example, in a case where the low level voltage of the input signal is 0 V and the high level voltage of the input signal is in a range of from +1.0 V to +5.0 V, the voltage range in which the reference voltage ($V_{ref}$) is changeable is set to a range of from +1.0 V to +5.0 V so as to match the voltage range (+1.0 V to +5.0 V) which is allowable as the input voltage. In addition, the gate voltage of the switching element Q12 may be changeable by setting the voltage dividing resistors (R13, R14) to variable resistors.

In addition, as another difference, there is one output line of the differential amplification circuit 40, and the output line is connected to the drain terminal of the switching element Q42. In a case where an output signal output from the control device 1 has a waveform obtained by inverting the operation waveform of the input signal, the output line of the differential amplification circuit 40 may be connected to the drain terminal of the switching element Q41.

The switch device 100 includes a main switch $Q_M$ and a voltage stabilization circuit 60 in addition to the control device 1. The main switch $Q_M$ switches between the ON state and the OFF state by the control device 1. The main switch $Q_M$ is formed of a GaN element. The threshold voltage (gate threshold voltage) of the main switch $Q_M$ is a minus voltage. The threshold voltage is a gate voltage that turns on or off the main switch $Q_M$. The main switch $Q_M$ operates in a range of from −18.0 V to +5.2 V.

The voltage stabilization circuit 60 is connected to stabilize the gate voltage of $Q_M$ of the main switch. The voltage stabilization circuit 60 is connected between the output line of the control device 1 and the main switch $Q_M$. The voltage stabilization circuit 60 includes a switching element Q61, resistors R61 and R62, and a current source 63. The switching element Q61 is formed of a GaN semiconductor. The resistor R62 is connected between the constant current circuit included in the current source 50 and the power supply (0 V). The connection point between the resistor R62 and the constant current circuit included in the current source 50 is connected to the gate terminal of the switching element Q62 through the resistor R63. The resistor R63 is a gate resistor of the switching element Q62. The drain terminal of the switching element Q61 is connected to a current source 64. The connection point between the drain terminal of the switching element 61 and the current source 64 is connected to the gate terminal of the main switch $Q_M$.

The constant voltage circuit connected to the low potential side of the voltage stabilization circuit 60 includes resistors R581 and 582 and a switching element Q58. The connection form of the constant current circuit is the same as those of the other current sources included in the current source 50.

In addition, in the switch device 100, the voltage stabilization circuit 60 may stabilize the gate voltage by connecting the tracking circuit to the drain and source of the main switch $Q_M$ and tracking the gate voltage.

Next, the gate voltage characteristic of the switch device 100 according to one or more embodiments will be described in comparison with the gate voltage characteristic of the switch device 200 according to Comparative Example.

Figure 6:
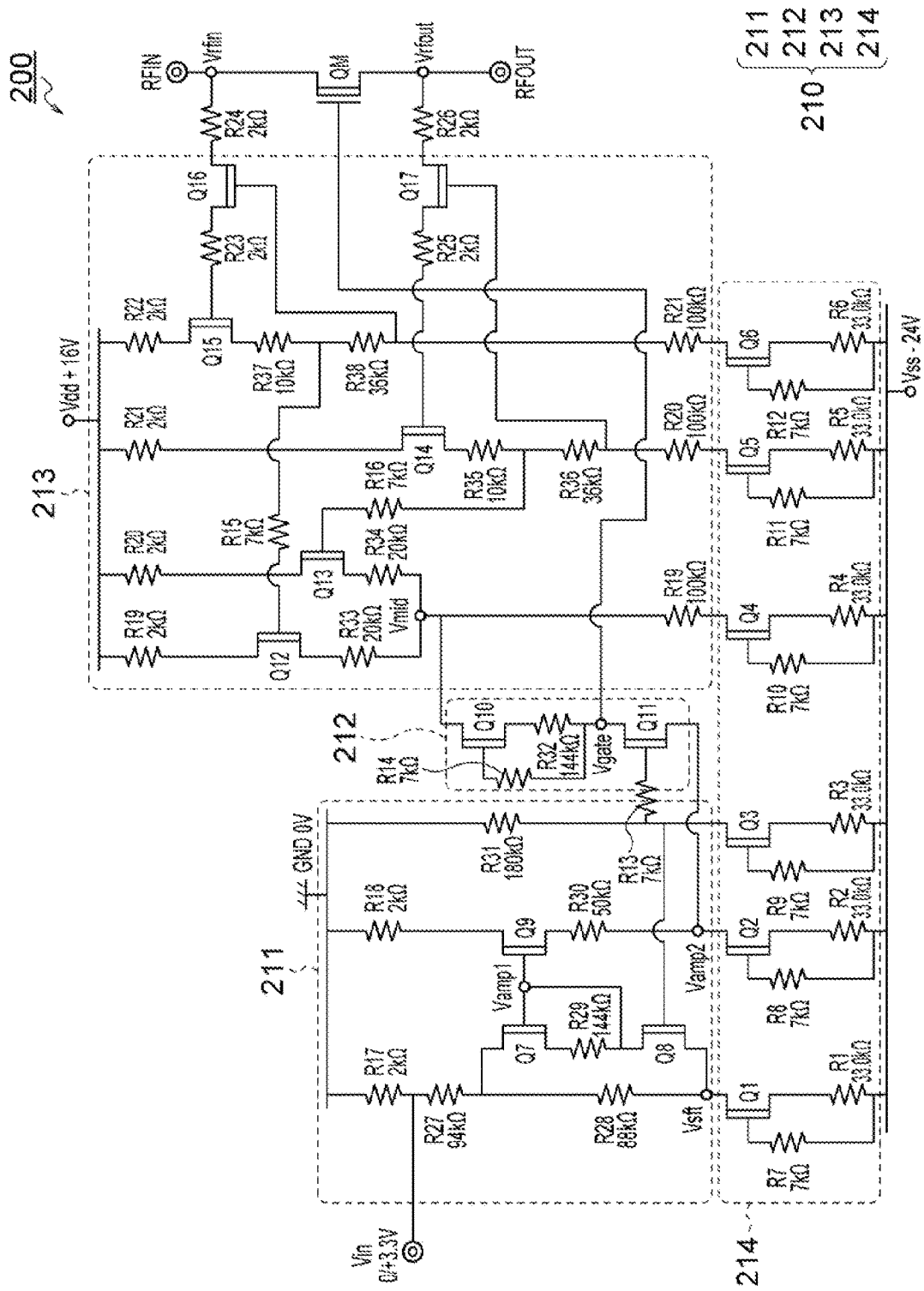
FIG. 6 is a circuit diagram of a switch device in Comparative Example.

First, the circuit configuration of the switch device 200 according to Comparative Example will be described. FIG. 6 is a circuit diagram of the switch device 200 according to Comparative Example.

As illustrated in FIG. 6, the switch device 200 includes a control device 210 and a main switch $Q_M$. The control device 210 includes an input signal amplification circuit 211, a gate voltage selection circuit 212, and a tracking circuit 213. The circuit configurations of the input signal amplification circuit 211, the gate voltage selection circuit 212, the tracking circuit 213, and the current source 214 are as illustrated in FIG. 6. In addition, the switching elements included in each circuit are formed of GaN. The resistance value of the resistor and the power supply voltage included in each circuit are as illustrated in FIG. 6. The input signal ($V_{in}$) input to the input terminal of the control device 210 is a switching signal with 0 V as the low level and +3.3 V as the high level. The operating voltage range of the main switch $Q_M$ is in a range of from −18.0 V to +5.2 V.

The input signal amplification circuit 110 switches between a current path conducting the resistor R28 and a current path between the drain and the source of the switching element Q7 with respect to ON and OFF of the input signal. The source terminal of the switching element Q8 and the source terminal of the switching element Q9 included in the input signal amplification circuit 110 are connected to different current sources. Namely, the source terminals of the plurality of switching elements Q8 and Q9 included in the input signal amplification circuit 110 are not commonly connected to one current source.

The gate voltage selection circuit 212 adjusts the gate voltage of the main switch $Q_M$ so that, in a case where the input voltage of the input signal is higher than the threshold voltage (1.65 V), the main switch $Q_M$ is turned ON, and in a case where the input voltage of the input signal is lower than the threshold voltage (1.65 V), the main switch $Q_M$ is turned off. The tracking circuit 213 stabilizes the gate voltage by tracking the gate voltage.

The voltage characteristics of the switch device 200 according to Comparative Example will be described. In the switch device 200 according to Comparative Example, the input side thereof is connected to the input signal amplification circuit 211. Unlike the differential amplification circuit 10 according to one or more embodiments, the input signal amplification circuit 211 does not have such a circuit configuration that GaN-based switching elements are symmetrically connected to amplify the difference. For this reason, the variation in the switching element included in the input signal amplification circuit 211 influences the output voltage, and thus, the shift width of the output voltage is increased with respect to the voltage of the input signal.

In addition, the input signal amplification circuit 211 is connected to two independent current sources. For this reason, in a case where the variation in the switching elements included in the two current sources is large, since the variation influences the output of the input signal amplification circuit, the shift width of the output voltage of the input signal amplification circuit 211 is further increased.

Figure 7A:
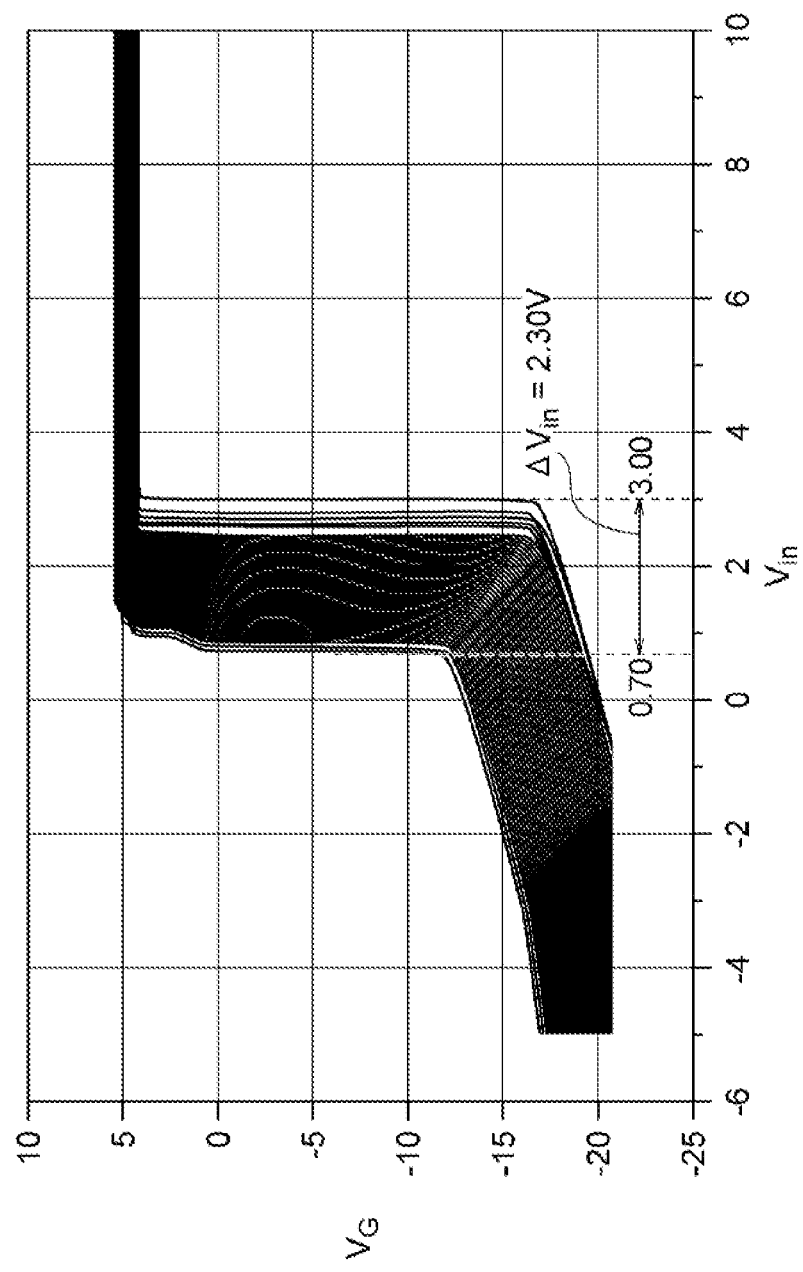
FIG. 7A is a graph illustrating characteristics of an output voltage of a control device (gate voltage of a main switch: $V_G$) with respect to an input voltage ($V_{in}$) in the switch device illustrated in FIG. 6.

FIG. 7A is a graph illustrating voltage characteristics of the control device 210 according to Comparative Example. The voltage characteristics are characteristics of the output voltage of the control device 210 with respect to the input voltage ($V_{in}$) input to the control device 210. The output voltage is the gate voltage ($V_G$) of the main switch $Q_M$.

As illustrated in FIG. 7A, in Comparative Example, the gate voltage of the main switch $Q_M$ becomes a state where any one of the ON voltage or the OFF voltage can be taken within a range of from 0.7 V to 3.0 V with the threshold voltage (1.65 V) of the input signal as a boundary. For this reason, for example, in a case where an input signal with an input voltage (0.8 V) is input to the control device 210, there is a possibility that the gate voltage may be the ON voltage although the gate voltage should originally be the OFF voltage.

Then, in a case where such an unstable state of the gate voltage is expressed by the voltage width ($\Delta V_{in}$) of the input voltage, the voltage width ($\Delta V_{in}$) in Comparative Example becomes 2.3 V. Namely, in the control device 210 according to Comparative Example, the unstable state of the gate voltage due to the variation in the GaN-based switching element occurs within a range of $\Delta$2.3 V in terms of the voltage width of the input voltage ($V_{in}$).

Figure 7B:
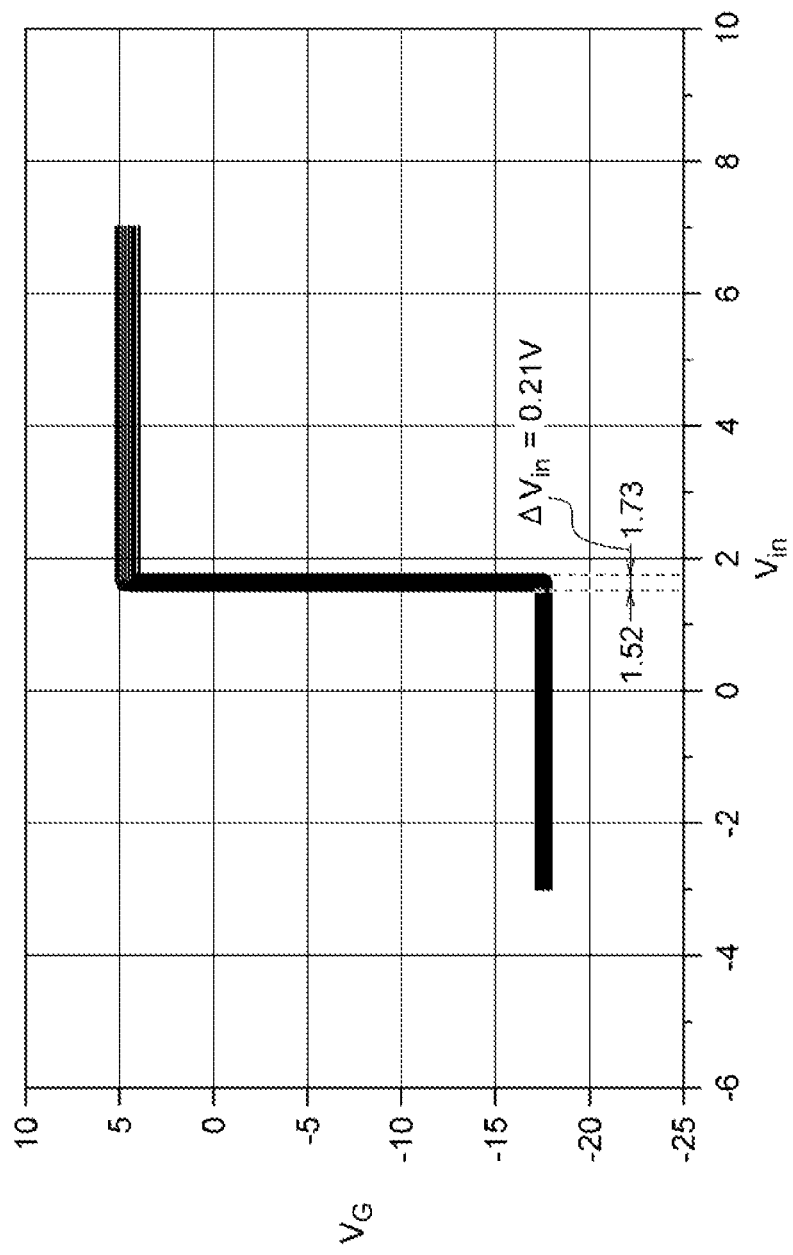
FIG. 7B is a graph illustrating characteristics of an output voltage of a control device (gate voltage of a main switch: $V_G$) with respect to an input voltage ($V_{in}$) in the switch device illustrated in FIG. 5.

FIG. 7B is a graph illustrating the voltage characteristics of the control device 1 according to one or more embodiments. The voltage characteristics are characteristics of the output voltage of the control device 1 with respect to the input voltage ($V_{in}$) input to the control device 1. The output voltage is the gate voltage ($V_G$) of the main switch $Q_M$.

In one or more embodiments, as illustrated in FIG. 7B, the gate voltage of the main switch $Q_M$ becomes a state where any one of the ON voltage or the OFF voltage can be taken within a range of from 1.52 V to 1.73 V with the threshold voltage (1.65 V) of the input signal as a boundary. In a case where such an unstable state of the gate voltage is expressed by the voltage width ($\Delta V_{in}$) of the input voltage, the voltage width ($\Delta V_{in}$) in one or more embodiments becomes 0.21 V. For example, in a case where an input signal with an input voltage (0.8 V) is input to the control device 210, the gate voltage of the main switch $Q_M$ is stabilized at the OFF voltage (−18.0 V). Namely, in the control device 1 according to one or more embodiments, the range of the input voltage at which the gate voltage becomes unstable is narrower than the range in Comparative Example. In one or more embodiments, it is possible to suppress the influence due to the variation in the GaN-based switching element and stabilize the output voltage of the control device 1.

Figure 8A:
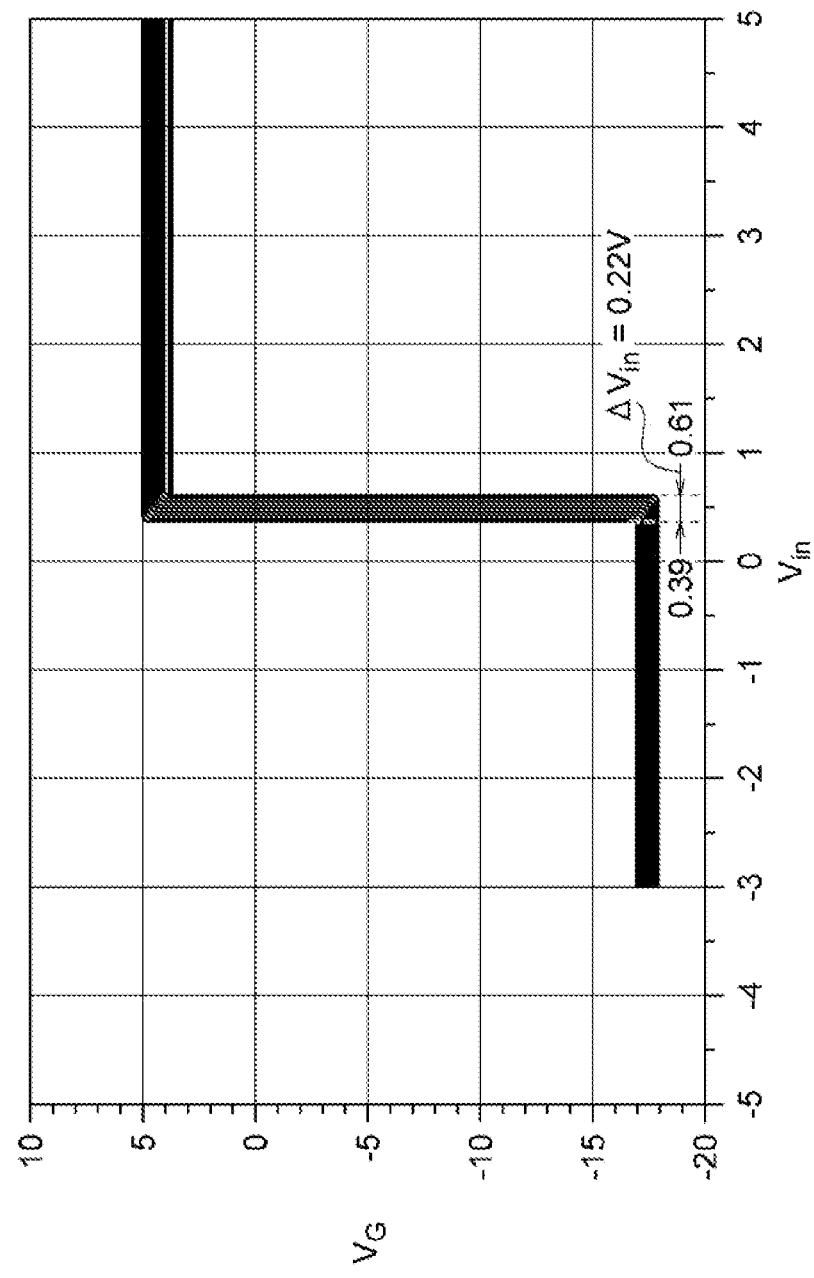
FIG. 8A is a graph illustrating characteristics of an output voltage (gate voltage of a main switch: $V_G$) with respect to an input voltage in a case where a reference voltage is set to 1.0 V in the switch device illustrated in FIG. 5.
Figure 8B:
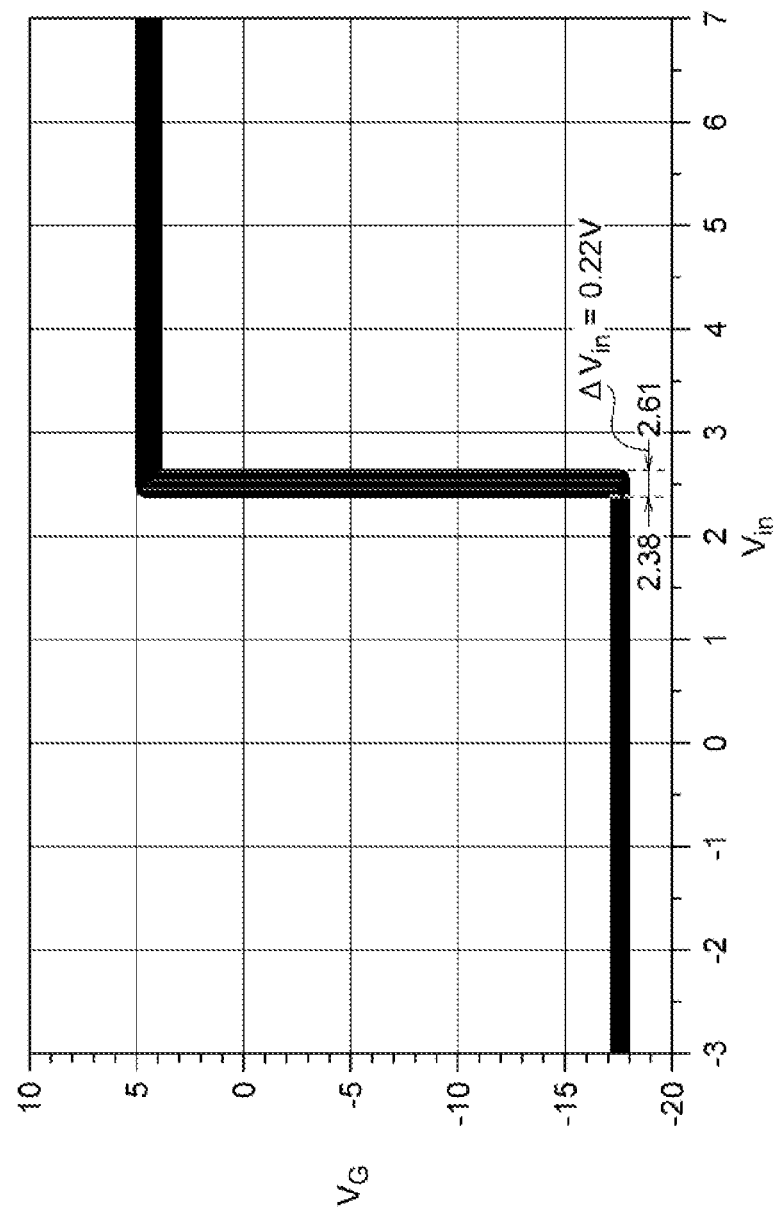
FIG. 8B is a graph illustrating characteristics of an output voltage (gate voltage of a main switch: $V_G$) with respect to an input voltage in a case where a reference voltage is set to 5.0 V in the switch device illustrated in FIG. 5.

Next, the voltage characteristics of the control device 1 when the reference voltage ($V_{ref}$) is changed will be described. FIG. 8A illustrates the voltage characteristics when the reference voltage ($V_{ref}$) is 1.0 V. FIG. 8B illustrates the voltage characteristic when the reference voltage ($V_{ref}$) is 5.0 V. In the graphs illustrated in FIGS. 8A and 8B, the horizontal axis represents the voltage ($V_{in}$) of the input signal, and the vertical axis represents the gate voltage ($V_G$) of the main switch $Q_M$.

The control device 1 according to one or more embodiments can change the control voltage of the switching element Q12 in accordance with the voltage range of the input signal. For example, in a case where the operating range of the input voltage ($V_{in}$) of the signal input to the gate terminal of the switching element Q11 is a range of from 0 V to 1.0 V and the threshold voltage of the input voltage ($V_{in}$) is set to 0.5 V, the reference voltage ($V_{ref}$) is set to 1.0 V. As illustrated in FIG. 8A, the gate voltage of the main switch $Q_M$ has an inverted ON/OFF waveform with the input voltage ($V_{in}$) of 0.5 V as a boundary. The range of the input voltage ($V_{in}$) at which the gate voltage becomes unstable is a range of from 0.39 V to 0.61 V, and the voltage width ($\Delta V_{in}$) is 0.22 V.

In addition, in a case where the operating range of the input voltage ($V_{in}$) of the signal input to the gate terminal of the switching element Q11 is a range of from 0 V to 5.0 V and the threshold voltage of the input voltage ($V_{in}$) is set to 2.5 V, the reference voltage ($V_{ref}$) is set to 5.0 V. As illustrated in FIG. 8B, the gate voltage of the main switch $Q_M$ has an inverted ON/OFF waveform with the input voltage ($V_{in}$) of 2.5 V as the boundary. The range of the input voltage ($V_{in}$) at which the gate voltage becomes unstable is a range of from 2.38 V to 2.61 V, and the voltage width ($\Delta V_{in}$) is 0.23 V. Namely, in one or more embodiments, even in a case where the reference voltage ($V_{ref}$) is changed in accordance with the operating range of the input voltage ($V_{in}$), the range of the input voltage in which the gate voltage becomes unstable is narrower than the range in Comparative Example. Therefore, in one or more embodiments, it is possible to suppress the influence due to the variation in the GaN-based switching element and to cope with a wide input voltage range while stabilizing the output voltage of the control device 1.

As described above, in one or more embodiments, the differential amplification circuit 10 amplifies the difference with respect to the input signal, and the differential amplification circuit 40 is connected to the output side of the differential amplification circuit 10 and clips the input voltage. In addition, the differential amplification circuit 10 includes a plurality of switching elements Q11 and Q12 formed of a GaN semiconductor. The differential amplification circuit 40 includes switching elements Q41 and 42. Namely, in one or more embodiments, since the differential amplification circuit is connected to the input side, the threshold voltages of the switching elements Q11 and Q12 are determined as the cross point of the output voltage by the differential pair formed by the plurality of switching elements Q11 and Q12. Therefore, it is possible to realize a control device with high robustness against the variation in the GaN semiconductor.

The control device 210 according to Comparative Example connects a circuit (input signal amplification circuit 211) which simply amplifies an input signal, to the input side. The output voltage of the control device according to Comparative Example is influenced by the variation in the GaN-based switch, and thus, the shift width of the output voltage is increased with respect to the voltage of the input signal. In addition, in the control device according to Comparative Example, although it is conceivable to reduce the influence due to the variation in the GaN-based switch by contriving a circuit configuration of the current source, it is not possible to sufficiently suppress the shift width of the output voltage. For example, supposing LVCMOS as the main switch, it is required to suppress the voltage width ($\Delta V_{in}$) of the input voltage down to 0.3 V or less. However, in the control device 210 according to Comparative Example, the voltage width ($\Delta V_{in}$) of the input voltage cannot be suppressed down to 0.3 V or less. In the switch device 200 according to Comparative Example, even if the circuit configuration of the current source is contrived, it was difficult to suppress the voltage width ($\Delta V_{in}$) of the input voltage down to 0.3 V or less.

In one or more embodiments, as illustrated in FIG. 7B, the voltage width ($\Delta V_{in}$) of the input voltage can be suppressed down to 0.3 V or less. Therefore, according to one or more embodiments, it is possible to maintain high robustness even in a case where a switch such as LVCMOS is controlled as a control target.

In addition, in one or more embodiments, the differential amplification circuit 20 for amplifying the voltage difference of the voltage output from the differential amplification circuit 10 is connected to the output side of the differential amplification circuit 10. The differential amplification circuit 20 includes switching elements Q21 and Q22 formed of a GaN semiconductor. Therefore, the operating range of the output signal can be expanded.

In addition, in one or more embodiments, the level shift circuit 30 for shifting the level of the voltage output from the differential amplification circuit 10 is connected to the output side of the differential amplification circuit 10. Therefore, even in a case where the voltage range of the input signal and the voltage range of the operating voltage of the main switch are different from each other between positive and negative, the main switch can be operated.

In addition, in one or more embodiments, a circuit capable of changing the control voltage of the switching element Q12 is provided, and the differential amplification circuit 10 amplifies the difference between the input voltage of the input signal and the control voltage. Therefore, the input voltage range is expanded, and the input interface of the control device 1 can correspond to the same level as the Si-based device.

In addition, in one or more embodiments, the switching element formed of a GaN semiconductor is used in the current source 50. Therefore, it is possible to realize a high density and high heat resistance of the current source 50.

In addition, in one or more embodiments, a common constant current circuit (current source) is connected to each terminal of the plurality of switching elements Q11 and Q12 included in the differential amplification circuit 10. Therefore, it is possible to suppress the variation in the GaN-based switch in the current source.

In one or more embodiments, the plurality of switching elements Q11 and Q12 included in the differential amplification circuit 10 are symmetrically connected, an input signal is input to the control terminal (gate terminal) of the switching element Q11, and a reference voltage is input to the control terminal (Gate terminal). The voltage value of the reference voltage is set between the ON voltage (high level voltage value) and the OFF voltage (low level voltage value) of the input signal. Therefore, it is possible to realize a control device with high robustness while widening the input voltage range.

In addition, in one or more embodiments, the differential amplification circuit 20 may be an amplification circuit other than a differential type amplification circuit. In addition, the level shift circuit 30 is not limited to the differential type amplification circuit, and other circuit configurations may be used. The differential amplification circuit 40 is not limited to a differential type amplification circuit, but the differential amplification circuit may be a clipping circuit in which a diode or the like is connected.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims

EXPLANATION OF LETTERS OR NUMERALS

1: control device
10, 20, 40: differential amplification circuit
30: level shift circuit
50: current source
60: voltage stabilization circuit 100: switch device
110: input signal amplification circuit
200: switch device
210: control device
211: input signal amplification circuit
212: gate voltage selection circuit
213: tracking circuit
512: gate voltage selection circuit
513: tracking circuit
Q11, Q12, Q21, Q22, Q31, Q32, Q41, Q42, Q51 to Q58, Q61, Q62: switching element
R11, R12, R21, R22, R28, R31, R32, R41 to R44, R61, R62, R63, R511, R512, R521, R522, R531, R532, R541, R542, R551, R552, R561, R562, R571, R572, R581, R582: resistor

What is claimed is:

1. A control device comprising:
   a differential amplification circuit that amplifies a difference with respect to an input signal;
   a level shift circuit that is connected to an output side of the differential amplification circuit; and
   a clipping circuit that is connected to an output side of the level shift circuit and that clips an input voltage,
   wherein the differential amplification circuit includes a plurality of switching elements formed of a GaN semiconductor, and
   the clipping circuit includes a switching element that:
     is formed of the GaN semiconductor,
     limits a voltage on a high-level side to a limit voltage that is lower than an upper limit voltage input to the clipping circuit, and
     limits a voltage on a low-level side to a limit voltage that is higher than a lower limit voltage input to the clipping circuit.

2. The control device according to claim 1, further comprising:
   an amplification circuit that is connected to the output side of the differential amplification circuit and amplifies a voltage difference of voltages output from the differential amplification circuit, wherein
   the level shift circuit is connected to an output side of the amplification circuit, and
   the amplification circuit includes a switching element formed of the GaN semiconductor.

3. The control device according to claim 1, wherein the level shift circuit:
   shifts a level of a voltage output from the differential amplification circuit, and
   includes a switching element formed of the GaN semiconductor.

4. The control device according to claim 1, further comprising:
   a voltage variable circuit that is capable of changing a control voltage of the switching element included in the differential amplification circuit, wherein
   the differential amplification circuit amplifies the difference between a voltage of the input signal and the control voltage.

5. The control device according to claim 1, further comprising:
   a current source that is connected to the differential amplification circuit, wherein
   the current source includes a switching element formed of the GaN semiconductor.

6. The control device according to claim 1, further comprising:
   a current source that is commonly connected to each terminal of the plurality of switching elements included in the differential amplification circuit.

7. The control device according to claim 1, wherein
   the plurality of switching elements included in the differential amplification circuit are symmetrically connected,
   the input signal is input to a control terminal of one switching element among the plurality of switching elements,
   a reference voltage is input to a control terminal of the other switching element among the plurality of switching elements,
   the input signal indicates any one of a high level voltage value and a low level voltage value, and
   the voltage value of the reference voltage is set between the high level voltage value and the low level voltage value.

8. A control device comprising:
   a differential amplification circuit that amplifies a difference with respect to an input signal;
   an amplification circuit that is connected to the output side of the differential amplification circuit and amplifies a voltage difference of voltages output from the differential amplification circuit;
   a level shift circuit that is connected to an output side of the amplification circuit; and
   a clipping circuit that is connected to an output side of the level shift circuit and that clips an input voltage, wherein
   the differential amplification circuit includes a plurality of switching elements formed of a GaN semiconductor,
   the clipping circuit includes a switching element that:
     is formed of the GaN semiconductor,
     limits a voltage on a high-level side to a limit voltage that is lower than an upper limit voltage input to the clipping circuit, and
     limits a voltage on a low-level side to a limit voltage that is higher than a lower limit voltage input to the clipping circuit, and
   the amplification circuit includes a switching element formed of the GaN semiconductor.

9. A control device comprising:
   a differential amplification circuit that amplifies a difference with respect to an input signal;
   a level shift circuit that is connected to an output side of the differential amplification circuit; and
   a clipping circuit that is connected to an output side of the level shift circuit and that clips an input voltage, wherein
   the differential amplification circuit includes a plurality of switching elements formed of a GaN semiconductor,
   the clipping circuit includes a switching element that:
     is formed of the GaN semiconductor,
     limits a voltage on a high-level side to a limit voltage that is lower than an upper limit voltage input to the clipping circuit, and
     limits a voltage on a low-level side to a limit voltage that is higher than a lower limit voltage input to the clipping circuit,
   the plurality of switching elements included in the differential amplification circuit are symmetrically connected,
   the input signal is input to a control terminal of one switching element among the plurality of switching elements, a reference voltage is input to a control terminal of the other switching element among the plurality of switching elements, the input signal indicates any one of a high level voltage value and a low level voltage value, and the voltage value of the reference voltage is set between the high level voltage value and the low level voltage value.

\* \* \* \* \*